United States Patent [19]

Lechner et al.

[11] 4,381,878
[45] May 3, 1983

[54] CONTACT SPRING FOR LOW RESISTANCE CONNECTION OF A CIRCUIT BOARD TO A GROUNDED SUBASSEMBLY CARRIER

[75] Inventors: Ernst-Friedrich Lechner; Otto Meusel, both of Erlangen, Fed. Rep. of Germany

[73] Assignee: Siemens Aktiengesellschaft, Munich, Fed. Rep. of Germany

[21] Appl. No.: 184,471

[22] Filed: Sep. 5, 1980

[30] Foreign Application Priority Data

Sep. 25, 1979 [DE] Fed. Rep. of Germany ....... 2938760

[51] Int. Cl.³ .......................... H01R 4/64; H01R 9/09
[52] U.S. Cl. ................................ 339/14 R; 339/17 L; 339/65
[58] Field of Search ............ 339/17 L, 17 LM, 17 M, 339/14 R, 65, 66 R, 66 M, 17 C, 217 S

[56] References Cited

U.S. PATENT DOCUMENTS

| 2,950,458 | 8/1960 | Artz | 339/217 S |
| 3,576,515 | 4/1971 | Frantz | 339/74 R |
| 3,871,728 | 3/1975 | Goodman | 339/14 R |
| 4,129,351 | 12/1978 | Sugimoto et al. | 339/17 LM |

FOREIGN PATENT DOCUMENTS 2653216  3/1978  Fed. Rep. of Germany .

Primary Examiner—Neil Abrams
Attorney, Agent, or Firm—Kenyon & Kenyon

[57] ABSTRACT

A contact spring contained in a conforming recess in a guide channel has a U-shaped portion with projecting side tabs embracing the edge of a circuit board. The side tabs rest against conductors on the circuit board which carry circuit board potentials and establish a good electrical connection between the conductors and the contact spring. The contact spring also grips the circuit board. A spring leg on the contact strip goes through an opening in the guide channel and engages the subassembly carrier.

3 Claims, 4 Drawing Figures

CONTACT SPRING FOR LOW RESISTANCE CONNECTION OF A CIRCUIT BOARD TO A GROUNDED SUBASSEMBLY CARRIER

BACKGROUND OF THE INVENTION

This invention relates to a contact spring for a low resistance chassis connection of a circuit board to a subassembly carrier. The circuit board is equipped with electronic components and is held, in at least one insulating guide channel, on a subassembly carrier which has a highly conducting surface and is connected to ground (a reference potential).

As shown in DE-AS No. 26 53 216, one known device for equalizing the potential in electronic modular systems has a potential point on one subassembly which is connected, via a contact spring, to a corresponding reference potential point on the subassembly carrier. A contact bar connected to the subassembly carrier is provided as the reference potential point and is designed as a shielding housing, being realized as a copper strip or as an electrically highly conducting surface layer. The contact spring is held by a plastic part fastened to the subassembly.

It is an object of the invention to provide a contact spring which is easy to handle and ensures a reliable contact between the potential of the circuit board and the subassembly carrier, which in turn is connected to ground (the reference potential).

SUMMARY OF THE INVENTION

According to the present invention, this problem is solved by means of a contact spring which is conformably accepted in a recess in the guide channel and which has a U-shaped portion. The legs of the U-shaped portion have reslient tabs or depressions embracing the edge of the circuit board. The tabs rest against conductors on the circuit board carrying the potential and establish a highly conductive electrical connection to them. At the same time, positive mechanical engagement of the contact spring with the circuit board is made. The contact spring also has a spring leg which passes through an opening in the channel and the guide member and either snaps into a cooperating depression on the subassembly carrier or engages (hooks) behind the subassembly carrier.

According to the invention, the contact spring rests resiliently against conductors carrying the potential of the circuit board as well as resting against the highly conducting surface of the grounded subassemble carrier. This establishes a secure, electrical connection between them.

Handling during assembly is simple. The contact spring provided by the invention is placed in the conforming recess of the guide channel with its leg passing through the associated, appropriately sized, opening on the guide channel. The circuit board is then pushed into the U-shaped portion of the contact spring, immediately establishing a secure mechanical connection between the circuit board and the contact spring. When this assemblage is pushed into the subassembly carrier, the leg of the contact spring either snaps into a corresponding depression in the subassembly carrier or engages behind it. This holds the guide channel on the subassembly carrier, and electrical connection between the conductors, which carry the reference potential of the circuit board, and the grounded subassembly carrier is established.

DETAILED DESCRIPTION OF THE INVENTION

Figure 1:
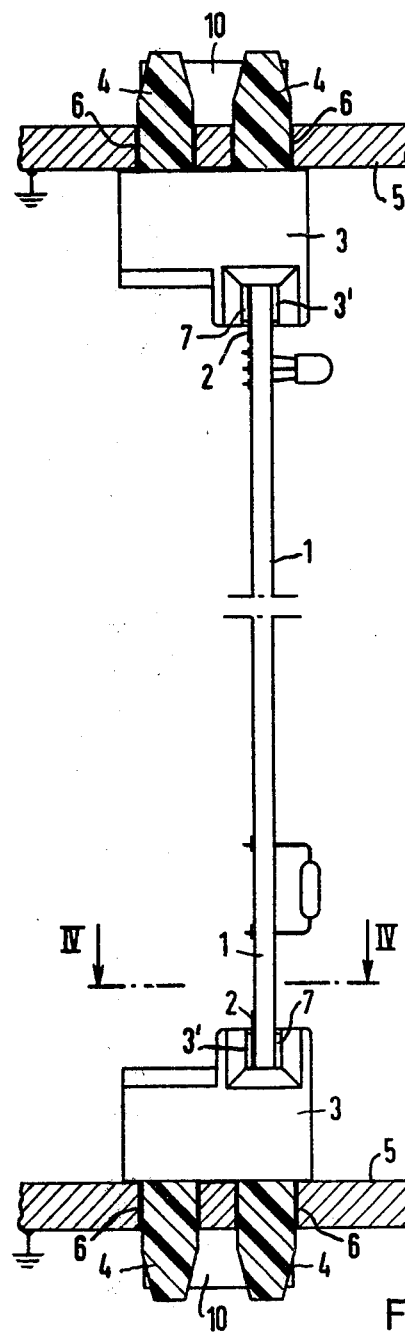
FIG. 1 is a view from the front, in partial cross-section, of a subassembly carrier with a circuit board inserted, taken along lines I—I of FIG. 2.

FIG. 1 shows a circuit board 1, (only the edge is visible) on which some electronic components, not specifically designated, are arranged. Circuit board 1 is received in guide members 3 have suitable slots or channels 3' for receiving the circuit board. Guide members 3 carry posts 4 which engage in holes 6 in a subassembly carrier 5. A contact spring 7 is inserted into suitably shaped recess 7' (See FIG. 4) in guide channel 3.

Figure 2:
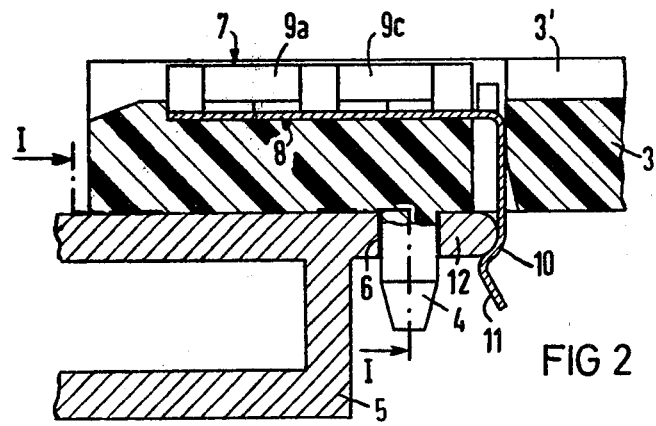
FIG. 2 is a longitudinal cross-section through the guide member of the invention, with the contact spring inserted but without the circuit board, taken along lines II—II of FIG. 4.
Figure 4:
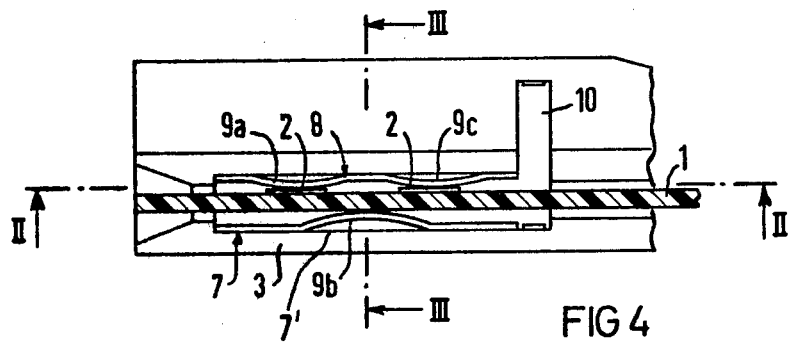
FIG. 4 is a view, in a cross-section looking from the top onto the guide channel, with the contact spring inserted and the circuit board in place, taken along lines IV—IV of FIG. 1.
Figure 3:
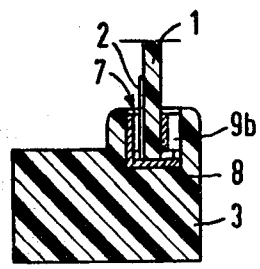
FIG. 3 is a view, in cross-section, through the guide channel, showing the contact spring inserted and the circuit board in place, taken along lines III—III of FIG. 4.

The design of contact spring 7 is best seen in FIGS. 2 and 4. In FIG. 2, the circuit board is omitted and in FIG. 4 it is inserted into the contact spring. Contact spring 7 has a U-shaped portion 8 which surrounds the edge of circuit board 1. U-shaped portion 8 is preformed and has several springy inwardly directed tabs or depressions 9a, 9b, and 9c. These resilient depressions extend into the slot and engage on circuit board 1, holding spring 7 in mechanical engagement with the board. Resilient spring depressions 9a and 9c project in from one side of the slot and rest against potential carrying conductors (conductor runs) 2 on circuit board 1. This establishes a highly conducting electrical connection between contact spring 7 and conductors 2. Contact spring 7 also has a spring leg 10 which passes through an opening in guide channel 3 and extends around and behind a projecting portion 12 of subassembly carrier 5. Subassembly carrier 5 is grounded and has, at least in those places where leg 10 of contact spring 7 rests against it, a highly conducting surface. For this purpose, subassembly carrier 5 may, for instance, be tinned. This assures a highly conducting electrical connection between contact spring 7 and grounded subassembly carrier 5.

In summary, a low resistance chassis connection between conductors 2, which carry a potential of circuit board 1, and grounded subassembly carrier 5 is provided, in a simple manner, via contact spring 7, the resilient depressions 9a and 9c of which rest against conductors 2 and via spring leg 10 which rests, under pretension, against subassembly carrier 5. Leg 10 of contact spring 7 not only establishes a low resistance chassis connection to subassembly carrier 5, but secures guide member 3, with contact spring 7, on the subassembly carrier. End portion 11 of spring leg 10 is reversed around formed end 12 of carrier 5. End 12 extends from carrier 5 perpendicular to the length of spring leg 10. By making end portion 12 thicker, a recess can be made in it into which part or all of the reversed portion 11 of spring leg 10 can engage, obtaining the same locking action. In either case, the subassembly carrier provides a detent-like surface on which reversed portion 11 of spring leg 10 rests.

What is claimed is:

1. A connector for removably mounting a circuit board on a subassembly carrier, the circuit board carrying electronic components and comprising at least one conductor run, the subassembly carrier comprising a conducting surface at ground potential, the connector providing a low resistance connection between the conductor run and the conducting surface of the carrier, the connector comprising:

a guide member comprising a channel for receiving the circuit board, a recess in the channel, a base wider than the channel, and an opening extending from the channel to the base, the opening wider than the channel;

a U-shaped contact conformably fitted in the recess, the contact comprising resilient side portions adapted to positively engage the circuit board on both sides and to make a highly conductive electrical connection to the conductor run; and a spring leg on the contact, the spring leg adapted for passage through the opening in the guide member, the spring leg wider than the channel and comprising a surface adapted to conformably engage the conducting surface of the subassembly carrier to make a highly conductive electrical connection thereto.

2. The conductor of claim 1 in which the subassembly carrier has a detent portion and the spring leg has an end which is reversed to removably engage the detent portion, the spring leg preventing motion of the guide member away from the subcarrier assembly when engaged with the detent portion.

3. The connector of claim 2 and further comprising: cooperating post and hole means located adjacent to the opening in the guide member and to the detent portion of the subcarrier assembly for preventing motion of the base of the guide member along the subcarrier assembly.

* * * * *